United States Patent [19]
Choi

[11] Patent Number: 5,801,993
[45] Date of Patent: Sep. 1, 1998

[54] NONVOLATILE MEMORY DEVICE

[75] Inventor: Woong Lim Choi, Chungcheongbuk-do, Rep. of Korea

[73] Assignee: LG Semicon Co., Ltd., Cheongju, Rep. of Korea

[21] Appl. No.: 911,373

[22] Filed: Aug. 7, 1997

[30] Foreign Application Priority Data

Oct. 1, 1996 [KR] Rep. of Korea ............... 1996 43434

[51] Int. Cl.[6] ........................................ G11C 11/34
[52] U.S. Cl. ........................ 365/185.28; 365/185.21; 365/185.29; 365/185.33; 365/218
[58] Field of Search ................. 365/185.21, 185.28, 365/185.29, 185.33, 218

[56] References Cited

U.S. PATENT DOCUMENTS

| | | | |
|---|---|---|---|
| 5,043,940 | 8/1991 | Harari | 365/218 |
| 5,422,842 | 6/1995 | Cernea et al. | 365/185.22 |
| 5,566,111 | 10/1996 | Choi | 365/185.21 |

Primary Examiner—David C. Nelms
Assistant Examiner—Trong Phan
Attorney, Agent, or Firm—Fleshner & Kim

[57] ABSTRACT

A nonvolatile memory device includes a plurality of program/select lines arranged in a row direction spaced apart from each other in first prescribed intervals, a plurality of bit lines arranged in a column direction spaced apart from each other in second prescribed intervals at a substantially right angle to the plurality of the program/select lines to form a matrix of a plurality of square areas, and a plurality of control lines disposed in the column direction and adjacent to the bit lines in a one-to-one correspondence. Each cell is disposed in one of the square areas, and has a source, a drain, and a channel region. Further, a select/program gate of each cell allows the selection of the cell for programming and conducting the programming by means of charge carriers. A floating gate stores the charge carriers by means of tunneling through the channel region during erasure and provides the stored charge carriers to the program/select gate through the tunneling diode during programming. A control gate controls an amount of the charge carriers provided from the floating gate to the program/select gate. The program/select gates in the cells disposed in the same row are commonly connected to one of the program/select lines, and the control gates in the cells disposed in the same column are commonly connected to one of the control lines. The sources (or drains) in the cells disposed in the same row are commonly connected to one of the bit lines, together with the drains (or sources) of the cells disposed in an adjacent row.

25 Claims, 10 Drawing Sheets

FIG.9B

|  |  | Vcc | Vcc | CL[S] | CL[US] | BL[S] | BL[US] | SUB |
|---|---|---|---|---|---|---|---|---|
| programming | | 10 | 0 | -6~-3 | 5 | 1[BLn] 0[BLn-1] | 1[one of BLm for m≥n+1] 0[othes] | 0 or -6[well] |
| erasure | PSL-FN | -8 | 0 | 8 | 0 | float | float | 0 |
| | BL-FN | 0 | 0 | 10 | 0 | -5 | float | 0 |
| | Drain-CHE | 5 | 0 | 12 | 0 | 7 | float | 0 |
| | Source-CHE | 2 | 0 | 10 | 0 | 5 | float | 0 |
| read | | Vcc | 0 | Vcc | 0 | 1 | 1[one of BLm for m≥n+1] 0[others] | |

PSL-FN:tunneling using program/select lines
BL-FN:tunneling using bit lines
Drain-CHE:hot carrier injection using drains
Source-CHE:hot carrier injection using sources
PSL[CS]:selected program/select lines
PSL[US]:unselected program/select lines
CL[S]:selected bit lines
CL[US]:unselected control lines
BL[S]:selected bit lines
BL[US]:unselected bit lines
SUB:substrate

NONVOLATILE MEMORY DEVICE

BACKGROUND OF THE INVENTION

1. Field of the Invention

The present invention relates to a memory device, and more particularly, a nonvolatile memory device.

2. Background of the Related Art

The packing density of a conventional nonvolatile memory corresponds in a one to one fashion to the number of memory cells. When nonvolatile semiconductor memory devices, such as EEPROM and flash EEPROM, are used as mass storage media, it is difficult to overcome the high cost-per-bit of the memories. Further, nonvolatile memory chips of low power consumption are required for application of the nonvolatile memories to portable products. In order to lower the cost-per-bit, multibit-per-cell has been actively studied.

A multibit cell stores data of over two bits in one memory cell to enhance the density of data on the same chip area without increasing the size of the memory cell. In order to implement a multibit cell, more than two threshold voltage levels may be programmed on each memory cell. For example, in order to store data of two bits for every cell, the respective cells must be programmed in $2^2$ (four) threshold levels. The four threshold levels correspond to logic states 00, 01, 10, and 11, respectively. However, a problem arises due to statistical distribution value of about 0.5V during the multi-level programming.

The distribution is reduced by precisely setting the respective threshold levels, and more levels can be programmed, which increases the number of bits per cell. To reduce the voltage distribution, repeated programming and verification are performed in the conventional method. For programming, a series of voltage pulses are applied to the cells to adjust the threshold levels. To verify whether a cell has reached an intended threshold level, a read operation is performed between the respective programming voltage pulses. Programming and verification are completed when the verified threshold level reaches the intended threshold level.

In the conventional method of repeated programming and verification, there is some difficulty in reducing the error distribution of the threshold level due to the limited pulse width of a program voltage. Further, the algorithm of repeated programming and verification is implemented with additional circuits, which increase the area of peripheral circuits on the chip. The repetitive method prolongs the programming time. To solve such problems, R. Cernea of SunDisk Co., Ltd. suggested a method of simultaneous programming and verification in U.S. Pat. No. 5,422,842.

FIG. 1A illustrates the symbol and circuit diagram of the nonvolatile memory. The nonvolatile memory cell includes a control gate 1, floating gate 2, source 3, channel area 4, and drain 5. When voltages sufficient to cause programming are applied to control gate 1 and drain 5, a current flows between drain 5 and source 3, and electrons are injected into the floating gate 2. This current is compared to a reference current, which varies for each threshold voltage level to be programmed. The auto verification of a programmed condition at the same time as programming can compensate for the disadvantage of the repetition of the program verification to some extent. When the current reaches a value equal to or smaller than the reference current, a programming completion signal is produced.

U.S. Pat. No. 5,043,940 discloses a method for conducting multi-level programming in which voltages applied to each terminal of the memory cell are fixed while reference currents for respective levels are varied. In these methods, as shown in FIG. 1B, the relation between the reference currents for detection and the cell threshold voltages is neither explicit nor linear.

In the above method, the threshold level is not adjusted by a voltage applied to the control gate of the memory cell. Hence, a separate optimization of the operations for programming and sensing is difficult. The unseparated currents for programming and monitoring prevent direct control of the threshold voltage of cell. Accordingly, a current controlled type programming method like aforementioned prior arts has a disadvantage that a direct and effective multi-level control is also difficult.

To eliminate such problems, the present inventor suggested a programming method of a voltage control type in which precise control of the threshold voltage of a multibit cell is done by means of a voltage applied to the control gate of the cell (U.S. patent application Ser. No. 08/542,651, commonly assigned to the same assignee). According to this method, a shift of the threshold voltage of a cell is precisely identical to a shift of the control gate voltage. Therefore, the threshold voltage can be ideally adjusted. However, a channel of the transistor is turned on at the start of programming (i.e., inverted) for current flow therethrough, and a current at a drain is decreased, as the programming proceeds, until the current flow level reaches a predetermined reference current value. Since the current flow starts at the maximum current from the start of programming and decreases thereafter, the initial power consumption is high.

The cell structures of EEPROM and flash EEPROM can be classified into two types, according to the position of floating gate on the channel region. The first type is the simple stacked gate structure in which the floating gate fully covers the channel region. The second type is the split-channel structure in which the floating gate covers only a portion of the channel region between the source and drain. The channel region not covered by the floating gate thereon is functionally called a select transistor. The select transistor and the floating gate transistor are connected in series to compose a memory cell.

The split-channel type cell is also classified into two different types according to the methods for forming the select transistor. A merged-split-gate cell has a control gate electrode of the floating gate transistor and a gate electrode of the select transistor integrated into one. A split-gate-cell has the control gate electrode of the floating gate transistor and the gate electrode of the select transistor separated from each other. The select transistor prevents the problem of over erasure and allows easy formation of contactless virtual ground array. The split-gate-cell allows easier hot electron injection from the source side.

FIG. 2A illustrates a diagram of a conventional nonvolatile memory cell of simple stacked gate type, and FIG. 2B illustrates a diagram of a conventional nonvolatile memory cell of split channel type. FIGS. 2A and 2B also illustrate the program and erasure mechanisms. In FIG. 2A, the stacked gate type cell comprises a control gate 6, a floating gate 7, a source 8, a drain 9, a channel region 10 and a gate 11 for use in erasure. In FIG. 2B, the split channel type cell comprises a control gate 13, a floating gate 14, a source 15, a drain 16, a channel region 17 and a gate 18 for use in erasure.

The split-channel cell employs a hot electron injection mechanism for programming the threshold voltage level. The merged-split-gate cell employs a drain side hot electron injection mechanism while the split-gate cell employs a source side hot electron injection mechanism. The split-channel cell has more power consumption due to the hot electron injection mechanism used during programming operation compared to tunneling mechanism. There is difficulty in the merged-split-gate cell in carrying out different kinds of ion injection two times into the drain region, as required for better hot carrier injection. There is difficulty in the split-gate cell for optimizing an oxide film thickness between the select transistor and the floating gate transistor, which is required for better hot carrier injection, for appropriate flow of current during an initial read operation and for preventing the degradation of the read current caused by degradation of the oxide film.

In the conventional split-channel cell, the electron injection (programming=data writing) is carried out by hot carrier injection through a gate oxide film adjacent to a channel. The electron erasure (deletion of data) is carried out either through a third gate other than a select gate or the control gate, or through a gate oxide film adjacent to a channel, or through the control gate.

Similar to other EEPROMs, FN-tunneling is employed for erasure. In case of the aforementioned split-channel cell, a thin gate insulating film of about 100 Å is required since the cell uses tunneling through the insulating film for erasure. The thin insulating film cannot assure reliable operation and degrades control gate coupling. In other words, as the cell size is further reduced, the coupling becomes even smaller, which is not favorable for low voltage/high speed operation.

Further, the erasure gates 11 and 18 are not necessary during the programming operation, and each of the conventional cells, shown in FIGS. 2A and 2B, has a structure equivalent to a double polygate structure. Conventionally, the programming operation is conducted using only electrodes of the control gate, source and/or drain, and the current paths for programming and verifying (or sensing) within a memory cell are unseparated, such that a direct and effective multi-level control has been difficult.

The above references are incorporated by reference herein where appropriate for appropriate teachings of additional or alternative details, features and/or technical background.

SUMMARY OF THE INVENTION

Accordingly, the present invention is directed to a non-volatile memory device that substantially obviates one or more of the problems and disadvantages of the related art.

One object of the present invention is to provide a nonvolatile memory cell and a method for programming the nonvolatile memory cell which allows an easy and simultaneous verification of single or multi-level programming.

Another object of the invention is to provide a region for programming and a region for verification which are completely or substantially separated from each other.

Another object of the present invention is to provide a nonvolatile memory cell and a method for single or multi-level programming of the nonvolatile memory cell in which each threshold level is adjusted by means of a voltage applied to a control gate.

Still another object of the present invention is to provide a linear relationship between each threshold level and a corresponding voltage applied to the control gate.

A further object of the present invention is to provide a nonvolatile memory cell and a method for single or multi-level programming the nonvolatile memory cell in which simultaneous verification of a programming is available.

Another object of the present invention is to initiate a cell in a turned-off state, to monitor a state of the cell channel during the programming and to force the programming to stop at a predetermined channel state after the cell is turned-on.

A further object of the present invention is to provide a split-channel cell which uses tunneling for programming and uses hot carrier injection or tunneling for erasure.

Still another object of the present invention is to provide a nonvolatile memory cell and a method for programming the nonvolatile memory cell which minimizes the consumption of current during programming.

Still another object of the present invention is to provide a split channel cell with a gate dielectric film reliability and to improve a coupling constant.

Another object of the present invention is to provide a non-volatile memory device which uses tunneling both for programming and erasure.

Still another object of the present invention is to provide a nonvolatile memory device which can minimize a consumption of current in programming and allows programming and threshold voltage state monitoring.

To achieve these and other advantages and in accordance with the purpose of the present invention, as embodied and broadly described, the nonvolatile memory device includes a plurality of program/select lines arranged in a row direction spaced apart from each other at a first prescribed intervals; a plurality of bit lines arranged in a column direction spaced apart from each other in a second prescribed intervals to form a matrix of a plurality of square areas; a plurality of control lines disposed in the column direction and adjacent to the bit lines in a one-to-one correspondence; and a plurality of cells, each disposed in one of the square areas and including a source, a drain, a channel region, a select/program gate for selecting a cell for programming and conducting the programming by means of charge carriers, a floating gate for storing the charge carriers by means of tunneling through the channel region in erasure of a tunneling diode and providing the stored charge carriers to the program/select gate through the tunneling diode in programming, and a control gate for controlling an amount of the charge carriers provided from the floating gate to the program/select gate, wherein the program/select gates in the cells disposed on the same row are connected to one of the program/select lines in common, the control gates in the cells disposed on the same column are connected to one of the control lines in common, and the sources(or drains) in the cells disposed on the same row are connected to one of the bit lines in common, together with one of the drains and sources of the cells disposed on an adjacent row.

The present invention may be achieved at least in part or in whole by a memory device comprising: a) a plurality of bit lines arrange in a first direction; b) a plurality of select lines in a second direction to form a matrix of predetermined areas; c) a plurality of control lines in a third direction which is substantially parallel with one of the plurality of bit lines and the plurality of select lines; d) a plurality of memory cells, each memory cell being disposed in each predetermined area defined by corresponding bit line and select line and including: i) first and second electrodes and a channel region therebetween, the first electrode being coupled to a corresponding bit line and the second electrode coupled to one of the plurality of bit lines adjacent to the corresponding bit line; ii) a first gate for storing a prescribed amount of charge carriers; iii) a second gate, coupled to a corresponding select line, for selecting a memory cell for a prescribed operation; and iv) a third gate, coupled to a corresponding control line, for inducing a transfer of charge carrier from the first gate to the second gate during programming operation, wherein a first current path due to the transfer of charge carriers is separate from a second current path due to a current flowing between the first and second electrodes.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

In the explanations of the present invention, a programming operation is defined as a data writing operation, and an erasure operation is defined as an operation in which all the data within a block to be erased are made into the same state. Therefore, an erasure operation may result in a state in which the threshold voltage of the memory cell is either low or high. In the preferred embodiments of the present invention described hereinafter, the erasure state is defined as the highest threshold voltage level for, e.g., an N type channel FET (Field Effect Transistor).

Figure 1A:
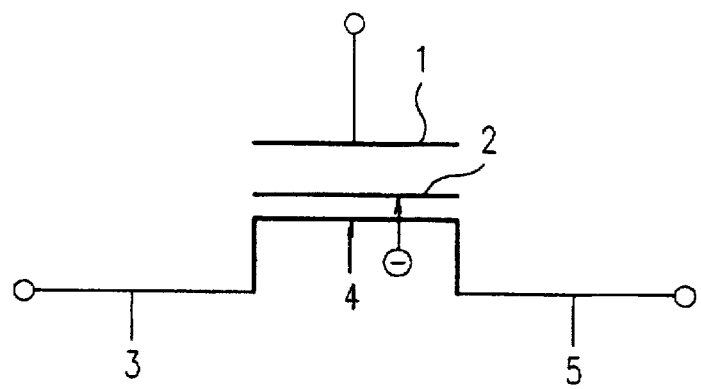
FIG. 1A illustrates a nonvolatile memory cell of the related art.
Figure 1B:
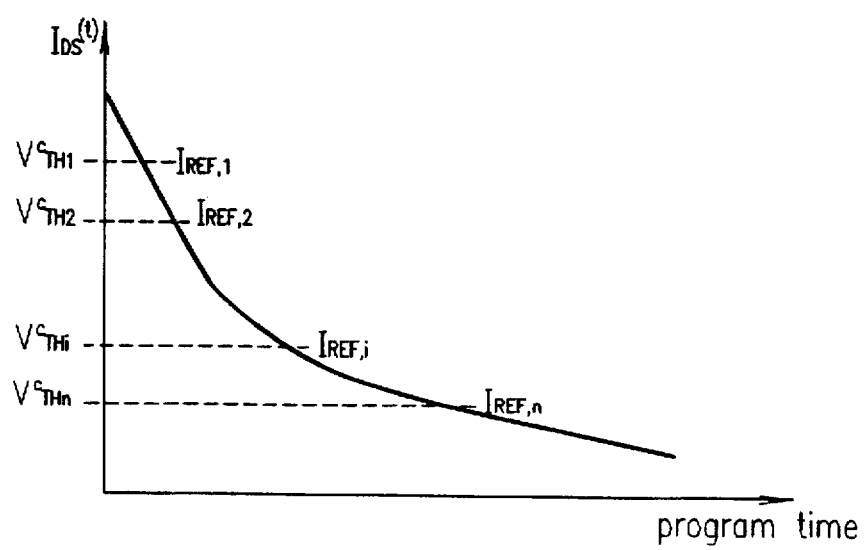
FIG. 1B illustrates a graph explaining the auto verify programming principle of the nonvolatile memory cell of FIG. 1A.
Figure 2A:
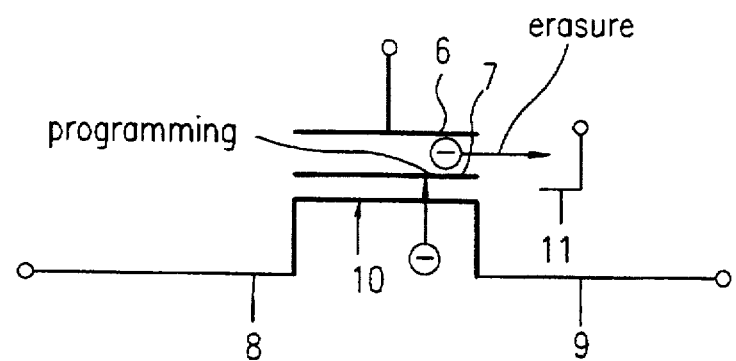
FIG. 2A illustrates a circuit of a prior art nonvolatile memory cell of simple stacked gate structure.
Figure 2B:
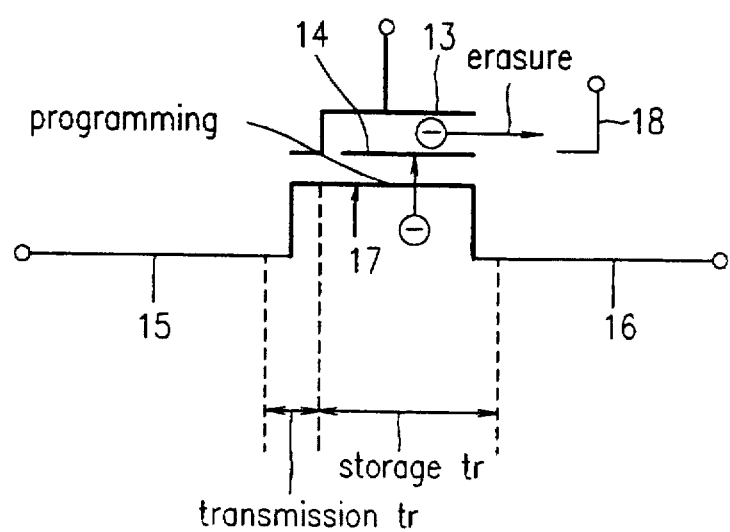
FIG. 2B illustrates a circuit of a prior art nonvolatile memory cell of split-channel structure.
Figure 3A:
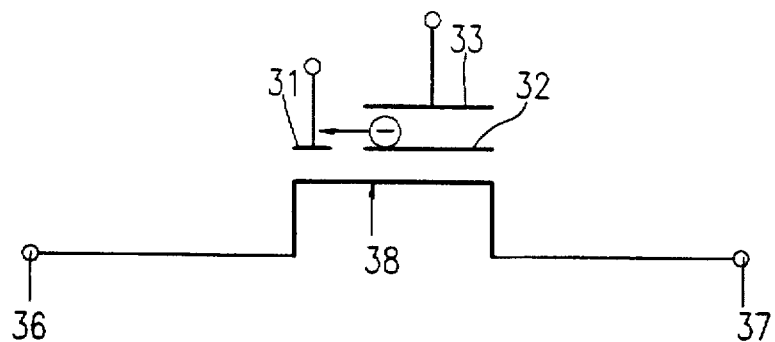
FIG. 3A illustrates a circuit of a nonvolatile memory cell in accordance with one preferred embodiment of the present invention.

FIG. 3A illustrates a diagram of a nonvolatile memory cell in accordance with one preferred embodiment of the present invention. The cell includes a program/select gate 31 for selecting a cell, for reading and writing/erasure and for programming. A floating gate 32 stores charges corresponding to stored data, and the charges are extracted from the floating gate 32 to the program/select gate 31 during the programming operation. A control gate 33 induces a potential at the floating gate 32 by a capacitive coupling, and controls the amount of the charges extracted from the floating gate 32 to the program/select gate 31.

Figure 3B:
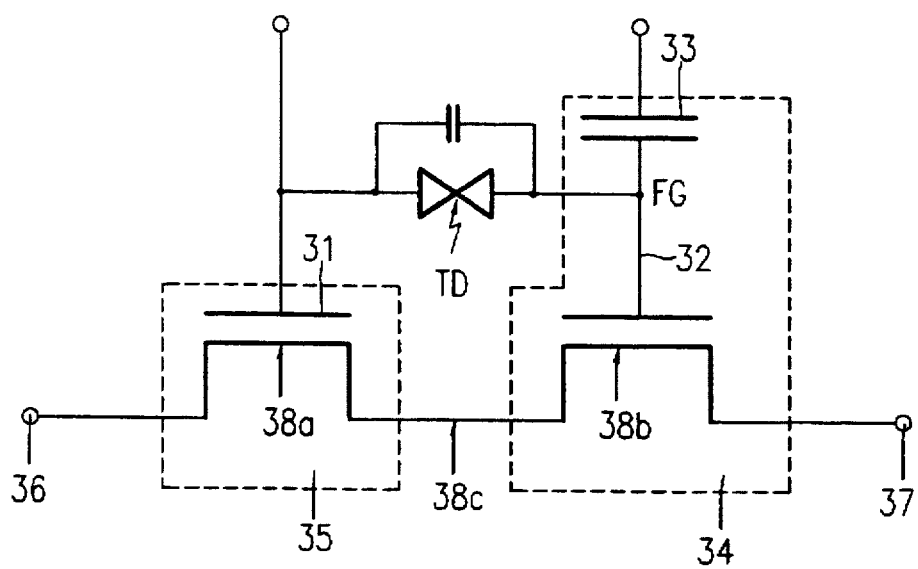
FIG. 3B illustrates a circuit showing the nonvolatile memory cell of FIG. 3A in view of its functions.

FIG. 3B illustrates a functionally equivalent schematic diagram of the nonvolatile memory cell shown in FIG. 3A. A storage transistor 34 includes a control gate 33, a floating gate 32, a channel region 38b beneath the floating gate 32, and the drain 37 stores data in the floating gate 32. The select transistor 35, including a select/program gate 31, a channel region 38a under the select/program gate 31 and a source 36, switches on or off a current flow between the drain 37 and the source 36, irrespective of the state of the threshold voltage of the storage transistor 34, thereby giving selectivity to the cell. A region 38c between the select transistor 38a and the storage transistor 38b serves as a drain for the select transistor 35 and a source for the storage transistor 34. In the source side of an N type transistor, hot electrons are generated at the channel region 38b and are injected into the floating gate 32.

The nonvolatile memory cell of the present invention has an additional feature that the select/program gate 31 and the floating gate 32 form a tunnel diode TD. For an N type transistor, electrons are extracted from the floating gate 32 to the select/program gate 31 through the tunnel diode, in which the program/select gate 31 serves as a terminal during the programming operation. In other words, the electrons are extracted from the floating gate 32 to the program/select gate 31.

The structural feature of the tunnel diode TD, and the functions and operations of the cell transistor and each terminal makes the nonvolatile memory cell of the present invention novel over the prior art nonvolatile memory cell. Further, an applied voltage may be distributed to the program/select gate 31 and the control gate 33 appropriately for improving the selectivity during the programming operation of the cells in accordance with the present invention.

Figure 3C:
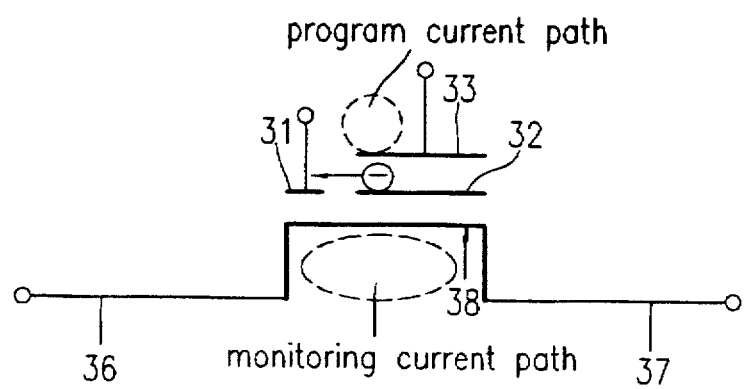
FIG. 3C illustrates a diagram showing current paths in the nonvolatile memory cell shown in FIG. 3A during programming.

As shown in FIG. 3C, the nonvolatile memory cell of the present invention includes a programming operation region which is completely separated from the channel region of the cell during the programming operation. That is, a programming current path and the channel current path (monitoring current path) are separated. Therefore, during the programming operation, a state of conductivity variation in the channel region 38 varied in correspondence to a charge amount variation in the floating gate 32 can be monitored at the same time and independent from the programming current path. In other words, the monitoring is conducted by the field effect transistor having the floating gate 32, select/program gate 31 and the channel 38. A general sense amplifier (not shown) is used to monitor a drain 37 or source 36 current of the cell.

A two stage-level or multi-level programming of a nonvolatile memory cell can be performed using the control gate 33, program/select gate 31 and floating gate 32 and monitoring an amount of charges, e.g., negative charges, provided from the floating gate 32 to the program/select gate 31, resulting in a current through the channel region 38 in the select transistor 35 during the two stage level or multi-level programming to verify the programming completion. The control gate 33, the floating gate 32 and the program/select gate 31 perform the function of the two stage level or multi-level programming, while the select transistor 35 performs the function of monitoring the amount of charges fed from the floating gate 32 to the program/select gate 31.

The program/select gate 31 is also used as means for selecting cells during a programming operation. A region for programming is completely separated from a region for verifying, and these two regions are connected through the floating gate 32 in erasure and through the program/select gate in cell selection for programming and in programming. The floating gate 32 and the program/select gate 31, which are in the programming region, with a thin dielectric layer form a tunnel diode TD allow tunneling of charge carriers. Accordingly, the programming is done by a tunneling mechanism through the tunnel diode.

The structure of the nonvolatile memory cell in accordance with the present invention has separate programming and monitoring paths during the programming operation. Hence, the memory cell of the present invention is a 4-terminal FET having the control gate 33, the source 36, drain 37 and select/program gate 31 during a programming operation. A prior art nonvolatile memory cell, however, is a 3-terminal FET. Therefore, the structure of the nonvolatile memory cell in accordance with the present invention facilitates simultaneous programming and monitoring. As can be appreciated by one of ordinary skill in the art, existing repeating program/verify methods can also be employed with the nonvolatile memory cell in accordance with the present invention.

In case of an N type transistor, an erasure operation of the nonvolatile memory cell of the present invention is an injection of electrons into the floating gate 32. Accordingly, the erasure operation may be done by a drain 37 side tunneling, or by a source side hot electron injection. For erasure using the hot carrier injection mechanism, a thin gate dielectric film between the channel region 38 or drain 37, and the floating gate 32 is not necessary to an extent required for tunneling, which allows significantly easier gate dielectric film forming process compared to existing process. Further, reliability is assured, and assumes improved coupling constant, thereby allowing a low voltage and high speed operation. Such advantages eliminate the problems of the prior art nonvolatile memory cells and avoid future problems associated with scaling-down of the nonvolatile memory cell, such as the low field leakage from tunneling and degradation of a gate oxide film. Accordingly, the nonvolatile memory cell of the present invention is favorable for scaling-down the size.

The nonvolatile memory cell of the present invention has a novel structure in which an independent selection of any one cell for either programming or erasure operation is allowed without the problems related to the reliability of cell array. During a programming operation, a selectivity is determined by the transistor having the control gate 33 and the drain 37. For example, in case of an N type transistor, programming can be done by a tunneling through the tunnel diode, and erasure can be done by a source side hot electron injection for an N-type transistor. In other words, the memory cell of the present invention may be used as an EEPROM or a flash EEPROM.

Figure 4:
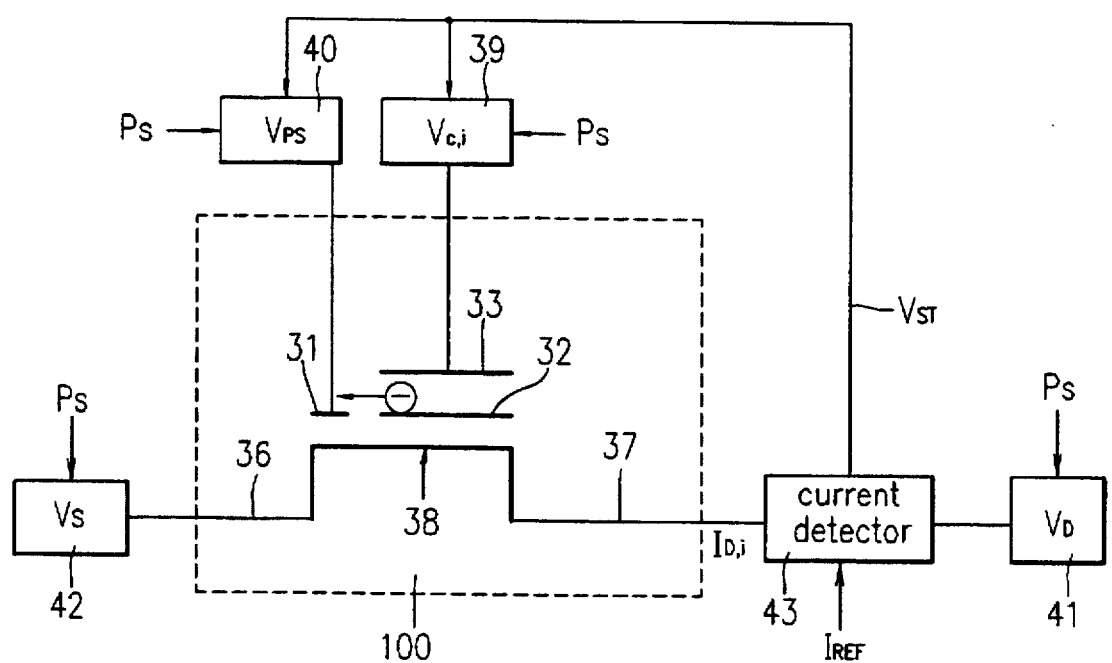
FIG. 4 illustrates a diagram showing a process of the current detection method for programming a nonvolatile memory cell.

Methods for single or multi-level programming and/or verification of the nonvolatile memory cell of FIGS. 3A–3C are explained with reference to FIGS. 4–6. In the method for programming and/or verifying the nonvolatile memory cell, a current detection method and a voltage detection method may be used. For convenience, the current detection method will be explained. FIG. 4 illustrates a diagram showing a process of the current detection method and a system for programming the nonvolatile memory cell. The diagram shown in FIG. 4 includes a first voltage source 39, a second voltage source 40, a third voltage source 41, a fourth voltage source 42, current detector 43 and a selected nonvolatile memory cell 100 (shown in FIGS. 3A–3B) of a memory device. The label Ps represents an i-th level programming start signal applied externally, and the label $V_{ST}$ represents a programming stop signal.

The first voltage source 39 provides a voltage $V_{C,i}$ (i=0, 1, 2,—, n-1) to the control gate 33 of the nonvolatile memory 100 for i-th level threshold voltage programming during a multi-level programming operation. Accordingly, the value of the first voltage $V_{C,i}$ varies with every threshold level programming. The second voltage source 40 provides a second voltage $V_{PS}$ to the program/select gate 31 for a single or a multi-level threshold voltage programming. The voltage $V_{PS}$ may vary, but has a constant positive voltage value at the end of the programming time. The third voltage source 41 induces a third potential or voltage $V_D$ at the drain 37 and a current detector 43 monitors a programmed state during a single or a multi-level programming, i.e., for monitoring a current $I_{D,i}(t)$ at the drain 37, and the fourth voltage source 42 applies a fourth voltage $V_S$ to the source 42. The fourth voltage $V_S$ may be either a ground voltage or a voltage lower than the third voltage $V_D$. The label $I_{D,i}(t)$ represents a value of the current flowing through the drain 37 over time.

The current detector 43 issues the programming stop signal $V_{ST}$ during i-th threshold voltage level programming when the value of the current $I_{D,i}(t)$ flowing through the drain 37 reaches to a reference current value $I_{REF}$ (for example, corresponding to a reference voltage $V^F_{REF}$ at the floating gate 32). A time $t_{p,i}$ represents the completion time of the programming operation. The threshold current $I_{TH}$ is dependent on the electrical characteristics of the nonvolatile memory cell. The threshold current $I_{TH}$ may be defined as a threshold voltage $V_{TH}$ necessary for current to flow in the nonvolatile memory cell. The current value $I_{D,i}(t)$ at the drain 37 may be re-defined as a current value dependent on time. This current value $I_{D,i}(t)$ represents a current at the drain 37 determined by a voltage $V_{F,i}(t)$ at the floating gate 32 during i-th threshold voltage level programming, which has a very small leakage current value due to a turn-off state (=a subthreshold state) of the channel at an initial stage of the programming operation. The turn-off state is maintained as the programming proceeds until the turn-on of the channel such that the current value increases. When the increased current value $I_{D,i}(t)$ reaches the reference current $I_{REF}$ of the current detector 43, the current detector 43 generates the programming stop signal $V_{ST}$.

Figure 5A:
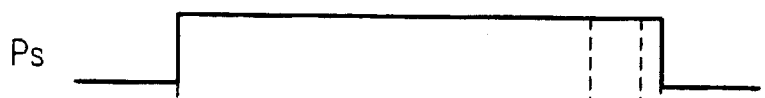
FIGS. 5A-5H illustrate diagrams showing waveforms at different nodes of FIG. 4.
Figure 5B:
Figure 5C:
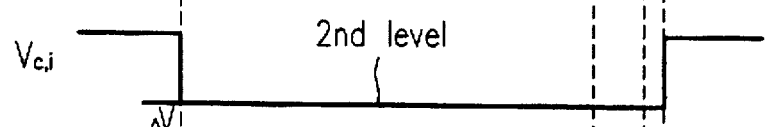
Figure 5D:
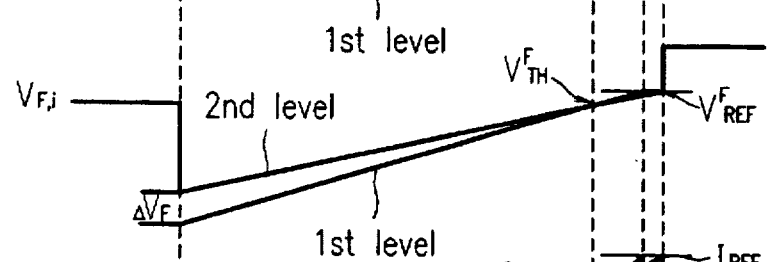
Figure 5E:
Figure 5F:
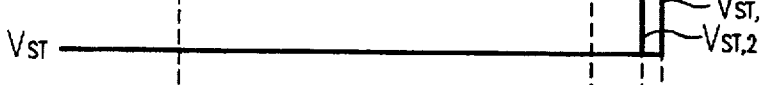
Figure 5G:
Figure 5H:
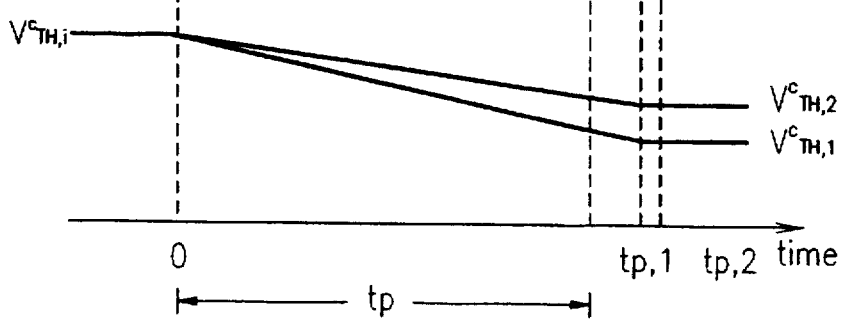
Figure 6:
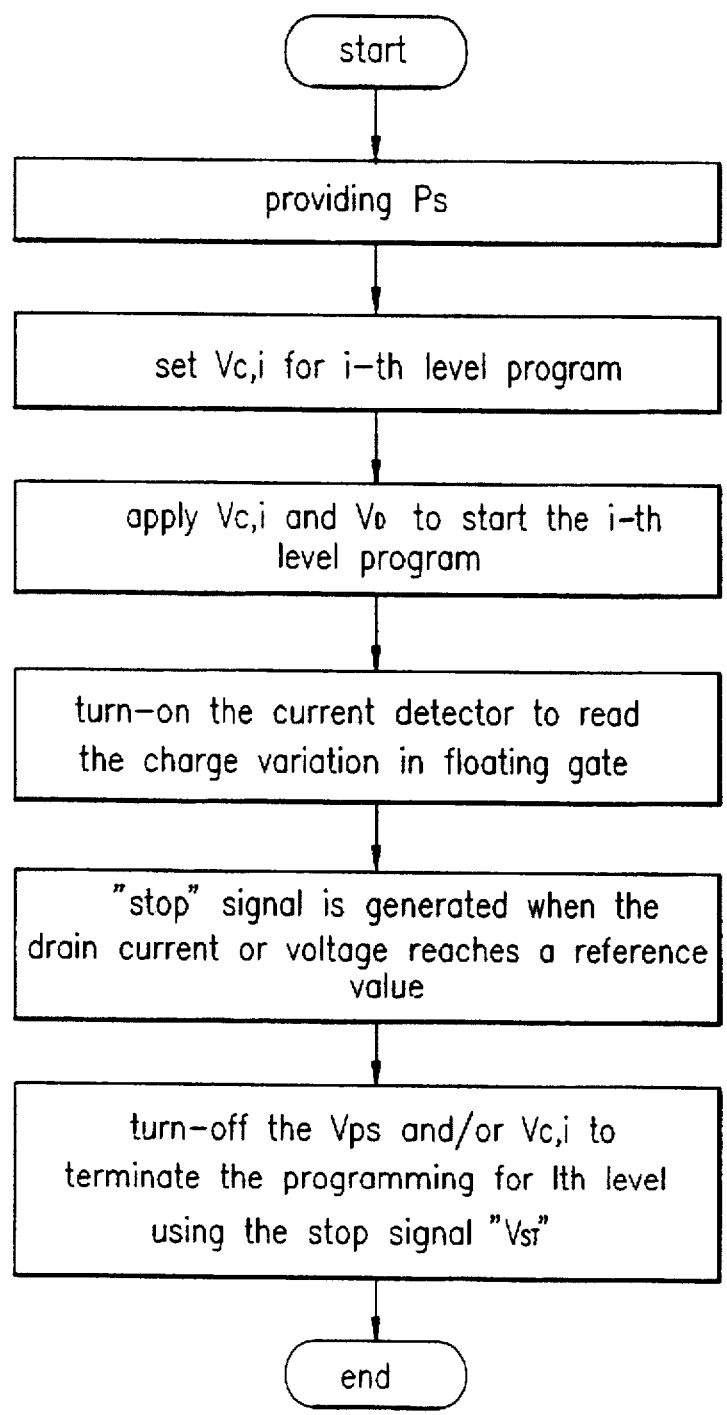
FIG. 6 illustrates a flowchart showing a single or multi-level programming process in accordance with the present invention.

FIGS. 5A–5H illustrate diagrams showing waveforms at different nodes of FIG. 4, and FIG. 6 illustrates a flowchart of a single or multi-level threshold voltage programming process for an N-type FET in accordance with the present invention. Prior to the programming operation, the cell is under an erased state, and the erased state may be the highest threshold voltage level. As can be appreciated, a P type FET having a P type channel formed on an n type substrate may be assumed. In such a case, the same operation can be performed with opposite polarities of the applied voltages, and the corresponding node and threshold voltages are opposite from the N-type FET.

Upon application of an external programming start signal Ps for single or multi-level programming, a positive voltage $V_{C,i}$ for the i-th level programming is applied to the control gate 33, as shown in FIG. 5A. Simultaneously, the current detector 43 is set up for verifying a variation of charge amount at the floating gate 32. Concurrent with the application of the programming start signal Ps (FIG. 5A), a positive voltage $V_{PS}$ (FIG. 5B) and a negative voltage $V_{C,i}$ (FIG. 5C) are applied from the first voltage source 39 and the second voltage source 40 to the control gate 33 and the program/select gate 31, respectively. Accordingly, a tunneling voltage $V_{run,i}(t)$ exists between the program/select gate 31 and the floating gate 32, and negative charges from the floating gate 32 are transferred by tunneling to the program/ select gate during the i-th threshold voltage level programming.

Simultaneously or after the application of the voltages $V_{C,i}$ and $V_{PS}$ to the control gate 33 and the program/select gate 31 respectively, the drain voltage $V_D$ and the source voltage $V_S$ are applied to the drain 37 and the source 36 from the third voltage source 41 and the fourth voltage source 42, respectively, and the current detector 43 is activated. Upon application of the voltages $V_{C,i}$, $V_{PS}$ and $V_D$ to the control gate 33, the program/select gate 31 and the drain 37, respectively, a voltage $V_{F,i}(t)$, as shown in FIG. 5D, on the floating gate 32 changes during the i-th threshold voltage level programming. The voltages $V_{C,i}$ and $V_{PS}$ have appropriate potentials so that an initial floating gate voltage $V_{F,i}$ turns off the channel region 38 of the FET, i.e., the initial floating gate voltage $V_{F,i}(t)$ is lower than the threshold voltage $V^F_{TH}$ at the floating gate 32.

Accordingly, there is no current flow through the drain 37 at the initial stage. As the programming operation proceeds, electrons are transferred, e.g., extracted, from the floating gate 32 to the program/select gate 31, to increase the floating gate voltage $V_{F,i}(t)$. When the floating gate voltage reaches the threshold voltage $V^F_{TH}$, as shown in FIG. 5D, the current $I_{D,i}(t)$, shown in FIG. 5E, flows through the drain 37. The current detector 43 monitors this drain current value $I_{D,i}(t)$ during the i-th threshold level programming. When the drain current $I_{D,i}(t)$ reaches a predetermined value $I_{REF}$, shown in FIG. 5E, the i-th threshold voltage level programming operation is completed, and a programming stop signal $V_{ST}$, shown in FIG. 5F, is generated.

The monitoring of the current $I_{D,i}(t)$ at the drain by the current detector 43 is equivalent to monitoring the variation of voltage or charge amount at the floating gate 32, which is extracted from the floating gate 32 to the program/select gate 31 during the programming operation, as shown in FIG. 5D. Similarly, the monitoring of the current $I_{D,i}(t)$ may be equivalent to a monitoring of a conductivity in the channel region 38.

When the programming stop signal $V_{ST}$ is applied to the first and second voltage sources 39 and 40, the first and/or second voltage sources 39 and 40 stop the application of a negative voltage $V_{C,i}$ and a positive voltage $V_{ps}$ to the control gate 33 and the program/select gate 31, respectively. In other words, once the current $I_{D,i}(t)$ is detected to be equal to or higher than the reference current at time $t=t_{p,i}$, the i-th threshold voltage level programming is completed. Therefore, the time $t_{p,i}$ represents the time for programming i-th threshold level in the cell.

As shown in FIG. 5E, when the drain current $I_{D,i}(t)$ reaches the reference current $T_{REF}$, the floating gate voltage reaches a reference voltage $V^F_{REF}$ corresponding to the reference current $I_{REF}$. The threshold current $I_{TH}$ is set to a value corresponding to the threshold voltage $V^F_{TH}$ at the floating gate 32, which is determined in advance during the fabrication of a nonvolatile memory. Since the storage field effect transistor 34 for verifying includes the floating gate 32 and the source 36, as shown in FIGS. 3A–3C, the threshold voltage $V^F_{TH}$ actually corresponds to the threshold voltage of the channel region 38.

FIG. 5H is a graph showing a variation of threshold voltages $V^C_{TH,1}$, and $V^C_{TH,2}$ at the control gate 33 for the i-th threshold level of one and two, respectively. FIG. 5H also shows that the threshold voltage $V^C_{TH,i}$ at the control gate 33 changes, e.g., decreases, as the order of the level varies, e.g., decreases, during the multi-level programming, which can be done by varying, e.g., decreasing, the voltage $V_{C,i}$ during programming. The first and second level program times $t_{P,1}$ and $t_{P,2}$ are different because the variations of the control gate voltage $V_{C,i}$ and threshold voltage $V^C_{TH,i}$ of the respective threshold voltage levels are different.

FIG. 5G is a graph showing charge amount variations at the floating gate 32 from an initial charge amount $Q_{F,0}(0)$ to (1) the charge amount $Q_{F,1}(t_{P,1})$ at the time when the first threshold voltage level programming is completed, and (2) the charge amount $Q_{F,2}(t_{P,2})$ at the time when the second threshold voltage level programming is completed. When the voltages $V_{F,1}(t)$ and $V_{F,2}(t)$ at floating gate 32 reach the reference voltage $V^F_{REF}$, corresponding to the reference current $I_{REF}(t=t_{P,1}, t=t_{P,2})$, the charge amount at floating gate 32 is decreased from the initial amount $Q_{F,0}(0)$ to amount $Q_{F,1}(t_{P,1})$ and to amount $Q_{F,2}(t_{P,2})$, respectively. After the completion of the programming operation, values of the charge amount $Q_{F,1}(t_{P,1})$, $Q_{F,2}(t_{P,2})$, etc. are maintained in the floating gate 32 to induce the programmed threshold voltage level on the control gate 33.

FIGS. 5A–5F also illustrate the programming and/or verification method for I-th threshold voltage programming when I=1 and 2. As shown in FIG. 5B, control gate voltages $V_{C,1}=V$ and $V_{C,2}=V-\Delta V$ are applied during the first and second (I=1 and 2) threshold level programming. Due to the different voltages applied at the control gate 1, the voltages $V_{F,2}(t)$ and $V_{F,2}(t)$ at the floating gate 2 rise at different rates. The currents $I_{D,1}(t)$ and $I_{D,2}(t)$ remain at about zero until the voltage $V_{F,1}(t)$ and $V_{F,2}(t)$ at the floating gate 2 reaches the threshold voltages $V^F_{TH,1}$ and $V^F_{TH,2}$. As the voltages $V_{F,1}(t)$ and $V_{F,2}(t)$ continue to increase, the currents $I_{D,1}(t)$ and $I_{D,2}(t)$ increase to $I_{REF}$, and the stop signals $V_{ST,1}$ and $V_{ST,2}$ are generated when $I_{D,1}(t_{P,1})$ and $I_{D,2}(t_{P,2})$ equal $I_{REF}$.

As shown in FIGS. 5D and 5E, the rate of increase of the voltage $V_{F,1}(t)$ and current $I_{D,1}(t)$ is greater than the rate of increase of the voltage $V_{F,2}(t)$ and current $V_{F,2}(t)$ since the magnitude of the voltage $V_{C,i}$ on the control gate 1 is greater during 1-th threshold voltage level programming than 2-th threshold voltage level programming. As shown, the programming stop signal is generated when the currents $I_{D,1}(t_{P,1})$ and $I_{D,2}(t_{P,2})$ equal $I_{REF}$. In this example, the time period to reach the threshold voltages $V^F_{TH,1}$ and $V^F_{TH,2}$ is shown to be the same. However, the time period to can vary for each level of programming by adjusting the voltage $V_{C,i}$ applied to the control gate during each I-th threshold voltage level programming and/or verification.

Further, as can be appreciated, the reference current $I_{REF}$ (or reference voltage $V_{REF}$) may be the threshold current $I_{TH}$ (or threshold voltage $V^F_{TH}$) or any arbitrary value greater than the threshold current $I_{TH}$. If the threshold current $I_{TH}$ equals the reference current $I_{REF}$, the programming completion time $(t_{P,i}=t_o)$ may be the same for every threshold voltage level programming by applying appropriate voltage $V_{C,i}$ at the control gate. Alternatively, the completion time $t_{P,i}$ may be different based on the control voltage $V_{C,i}$ applied.

Figure 7A:
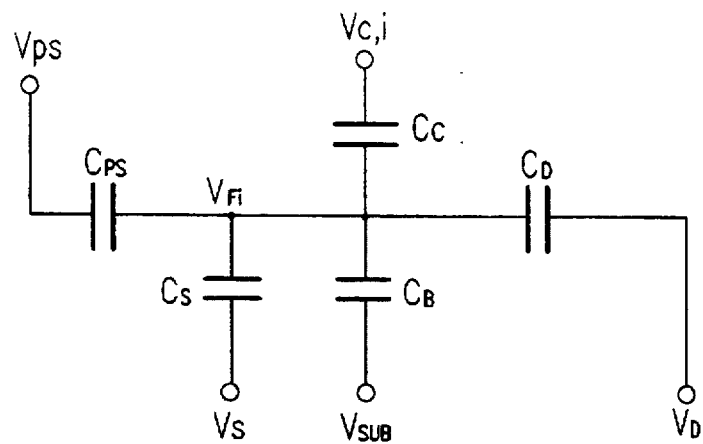
FIG. 7A illustrates a capacitance equivalent circuit of the nonvolatile memory cell shown in FIG. 3A.

Referring to FIG. 7A, the relationship between the voltage $V_{C,i}$ applied from the first voltage source 39 to the control gate 33 and the threshold voltage of the corresponding level, which is a significant result of the present invention, will be explained. FIG. 7A illustrates a capacitance equivalent circuit of the nonvolatile memory shown in FIG. 3. In FIG. 7A, the label $C_C$ represents the capacitance between the control gate 33 and the floating gate 32, the label $C_{ps}$ represents a capacitance between the program/select gate 31 and the floating gate 32, the label $C_D$ represents the capacitance between the drain 37 and the floating gate 32, the label $C_S$ represents the capacitance between the source 36 and the floating gate 32 and the label $C_B$ represents the capacitance between the substrate and the floating and program/select gates 32 and 33.

Sum $C_T$ of those capacitances can be expressed by the following equation (1):

$$C_T = C_C + C_{ps} + C_D + C_S + C_B \quad (1)$$

The coupling coefficients of the respective capacitances are defined by the following equations (2):

$$\alpha_C = C_C/C_T, \alpha_c = C_C/C_T, \alpha_{ps} = C_{ps}/C_T, \alpha_S = C_S/C_T \text{ and } \alpha_B = C_B/C_T \quad (2)$$

For convenience, the substrate and source voltages are assumed to be ground voltages, and the capacitances $C_S$, $C_B$ and coupling coefficients $\alpha_S$ and $\alpha_B$ can be ignored. The voltage at floating gate 32 during programming can be expressed by the following equation (3):

$$V_F(t) = \alpha_C V_C + \alpha_{ps} V_{ps} + \alpha_D V_D(t) + Q_F(t)/C_T \quad (3)$$
$$= \alpha_C[V_C - V^C_{TH}(t)] + \alpha_{ps} V_{ps} + \alpha_D V_D(t)$$

where $Q_F(t)$ represents an amount of charges at the floating gate 32.

In programming and/or verification, the threshold voltage $V^C_{TH}(t)$ at the control gate 33, induced by amount of charge carriers at the floating gate 32, is defined by the following equation (4):

$$V^C_{TH}(t) = -\frac{Q_F(t)}{C_C} \quad (4)$$

As indicated in equation (4), the threshold voltage $V^C_{TH}(t)$ is a threshold voltage shift induced by charge amount $Q_F$ at the floating gate 32 measured at the control gate 33 at time t. The threshold voltage shift refers to a threshold voltage measured at the control gate 33, which is caused by the charges accumulated at the floating gate 32. The threshold voltage $V^C_{TH}(t)$ measured at the control gate 33 is defined as a voltage at the control gate 33 when the drain current $I_D(t)$ reaches the reference current $I_{REF}$ (for example, the threshold current $I_{th}$) at the current detector 43. As explained, the threshold current $I_{th}$ can be defined arbitrarily (for example, $I_{TH}=1 \mu A$).

The threshold voltage $V^F_{TH}$ at the floating gate 32 is an inherent threshold voltage of the storage field effect transistor consisting of the floating gate 32, source 36, and drain 37 as shown in FIG. 3, which is dependent on manufacturing conditions, such as channel ion implantation and thickness of a gate insulator in fabricating the nonvolatile memory cell of FIG. 3. Therefore, the threshold voltage $V^F_{TH}$ of the floating gate 32 is always a constant. However, threshold voltage $V^C_{TH}$ at the control gate 33 is dependent on a amount of charge $Q_F$ at the floating gate 32.

Each programming and/or verification operation of each level is halted when the voltage $V_F(t)$ at the floating gate 32 reaches the reference voltage $V^F_{REF}$ at the floating gate 32 (for example, the threshold voltage $V^F_{TH}$ or an arbitrary reference voltage $V^F_{REF}$). When the drain voltage $V_D$ is constant, the level of current flow $I_D(t)$ is dependent on the voltage at the floating gate 32, and has a one to one relationship with the voltage $V_{F,i}$ at the floating gate 32. Accordingly, the programming and/or verification stop time point for each level corresponds to the time when the current $I_D(t)$ reaches the reference current $I_{REF}$. Therefore, in each threshold voltage level programming and/or verification, the voltage $V_F(t_P)$ of the floating gate 32 at the completion time of programming and/or verification completion for each level can be expressed by the following equation (5):

$$V_F(t_P) = V^F_{TH} = \alpha_C[V_C - V^C_{TH}(t_P)] + \alpha_{ps} V_{ps} + \alpha_D V_D(t_P) \quad (5)$$

Rearranging the equation (5) with regard to the voltage $V_C$ applied from the first voltage source 39 to the control gate 33, the following equation (6) is given:

$$V^C_{TH}(t_P) = V_C + \frac{\alpha_{ps} V_{ps} + \alpha_D V_D - V^F_{REF}}{\alpha_C} = V_C + V1 \quad (6)$$

where V1 is defined as:

$$V1 = \frac{\alpha_{ps} V_{ps} + \alpha_D V_D - V^F_{REF}}{\alpha_C} \quad (7)$$

If the three parameters of the program/select gate voltage $V_{ps}$, drain voltage $V_D$ and reference voltage $V^F_{REF}$ are adjusted to make the V1 a fixed constant at the completion time of each level programming and/or verification, the relationship of the control gate voltage $V_{C,i}$ and the threshold voltage $V^C_{TH,i}$ is linear to each other.

One of the ways of making the voltage V1 a fixed constant is to make each of the program/select gate voltage $V_{ps}$, the drain voltage $V_D$ and the reference voltage $V^F_{REF}$ a fixed constant for each threshold voltage level programming and/or verification. Making the reference voltage $V^F_{REF}$ constant is the same with making the reference current $I_{REF}$ constant. However, as can be noted in equation (5), the values of each of the program/select gate voltage $V_{ps}$ and the drain voltage $V_D$ can be constant if their values are the same at the completion time of each level programming and/or verification. In other words, although the program/select gate voltage $V_{ps}$ and the drain voltage $V_D$ may be variables dependent on time, the object of the present invention can be achieved if the voltages $V_D$ and $V_{ps}$ at the completion time of each level programming and/or verification are the same. As shown from equation (5), the control gate voltage $V_{C,i}$ at each i-th level also can be a variable dependent on time. In such a case, the voltage $V_C$ in equation (5) is a value at the completion time of each level programming and/or verification.

By making V1 a constant for each level programming, the control gate voltage $V_{C,i}$ required for i-th threshold level programming can be expressed according to equation (6) as the following:

$V^C_{TH,i} = V_{C,i} + V1$ (where i=0, 1, 2, 3, ..., n-1)  (8)

Figure 7B:
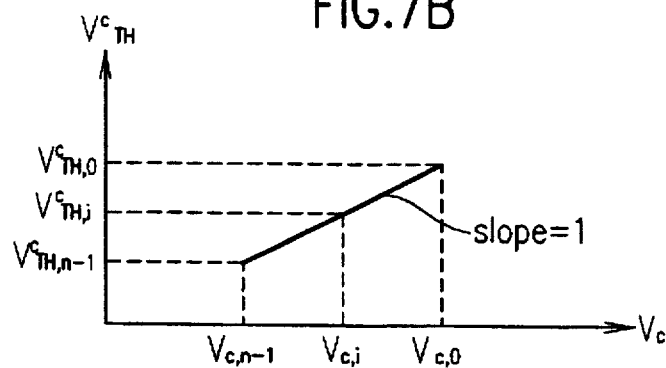
FIG. 7B illustrates a relation between threshold levels to be programmed and correspondingly applied control gate voltages, and a relation in a multi-level programming between an initial floating gate voltage for each level and reference currents.

As shown in equation (8), the threshold voltage levels to be programmed and the control gate voltages applied are linear with a slope of, e.g., 1, as shown in FIG. 7B. According to equation (4), the charge amounts in the floating gate 32 are also linear with respect to the control gate voltages.

Since the voltage $V_1$ is a constant as mentioned above, a shift $\Delta V_{C,i}$ of the voltage applied to the control gate 33 during a multi-level programming can be expressed directly in the following equation (9):

$$\Delta V_{C,i} = \Delta V^C_{TH,i} \quad (9)$$

From equations (8) and (9), it can be shown that a shift of a threshold voltage level $V^C_{TH,i}$ to be programmed can be accurately controlled by a shift of the control gate voltage $V_{C,i}$ in single or multi-level programming and/or verification. It can be shown that the control gate voltage becomes the threshold voltage when the constant shown in the equation (7) is set to zero.

The following two methods for monitoring a programming in case the above conclusion may be applicable to the programming of a nonvolatile memory.

The first method is a channel ON-TO-OFF method in which the channel is turned on at an initial stage of the programming to cause the greatest amount of drain current to flow. The charge carriers, e.g., electrons are injected into the floating gate during the programming and/or verification operation to cause the floating gate voltage to decrease with subsequent decrease of the drain current until the drain current reaches a predetermined reference current.

The second method is a channel OFF-TO-ON method, which is opposite to the channel ON-TO-OFF method, in which voltages are applied to each electrode for not only turning off the channel 38 at an initial stage of a programming operation, i.e., for causing the floating gate voltage to be lower than the floating gate threshold voltage $V^F_{TH}$, but also for causing the charge carriers, such as electrons, to be transferred from the floating gate 32 to the program/select gate 31. As the programming proceeds, the voltage in the floating gate rises to reach a voltage higher than the floating gate threshold voltage $V^F_{TH}$ at the end when the channel is turned on. A stop point of the programming may be a moment when the channel is turned on or may be any arbitrary time after the turn on. In other words, the reference current $I_{REF}$ may be the threshold current, or may be any arbitrary value greater than the threshold current $I_{TH}$, as discussed above.

Figure 7C:
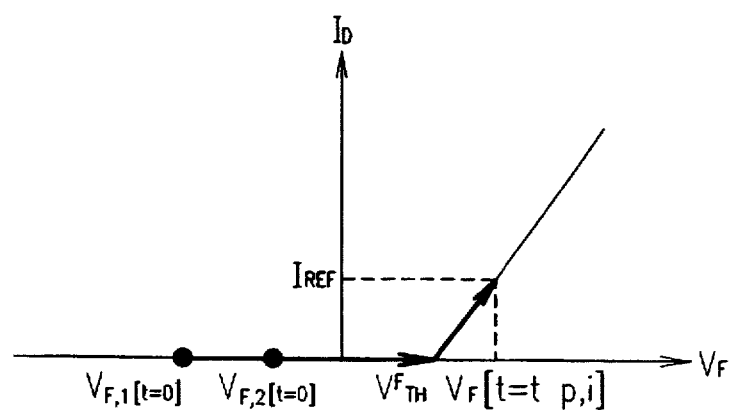
FIG. 7C illustrates a graph showing turn-on/turn-off points of a transistor and a relation between a programming end point and a drain current in a multi-level programming.

For multi-level programming and/or verification operation, as the control gate voltages, which corresponds to each of the threshold voltage levels, are varied, each of the initial floating gate voltages $V_{F,i}(t=0)$ of each level programming also are varied, which is shown well in FIG. 7B. For each level programming and/or verification, the $V^F_{REF}$ (or $I_{REF}$) is a constant, and the $V_{C,i}$ decreases as the i-th level changes, e.g., goes to a higher order. The drain current before the turn-on is substantially zero, and the turn on point and the programming and/or verification completion point are dependent on characteristics of a transistor, which is shown in FIG. 7C.

The present invention is related to the aforementioned OFF-TO-ON method, and a new nonvolatile memory cell, device and memory array to which the OFF-TO-ON method can be applicable with ease. In comparison to the ON-TO-OFF method, the OFF-TO-ON method has a very small power consumption. When an ON moment corresponding to the threshold voltage is detected as the programming stop point, a sense amplifier may be implemented very simply.

From the above, e.g., in the OFF-TO-ON method programming, when a shift $\Delta V^C_{TH,i}$ from the erased state, which is the highest level, to one of the corresponding threshold levels is determined, a programming and/or verification for the level can be done by applying a value obtained by subtracting the shift $\Delta V^C_{TH,i}$ to a desired level from already known highest level $V_{C,0}$ value used in programming as a control gate voltage, and then waiting until the automatic completion of the programming and/or verification is done by a detection circuit (the current detector 43, in case of this embodiment).

If a tunneling mechanism is used for programming, a positive voltage is applied to the select/program gate 31, a negative voltage is applied to the control gate 33, and a minimum voltage (for example, 1V) sufficient to monitor (sense) a current between the drain 37 and source 36, to turn on the select transistor 35 and to establish an electric field which is large enough to cause tunneling between the floating gate 32 and the program/select gate 31. The select transistor 34 should be turned on because monitoring of a state of the channel (a conductivity), i.e., a drain current is possible during programming.

Methods for determining the control gate voltage $V_{C,0}$ and the reference current $I_{REF}$ for use in the highest level programming will be explained. Once the desired highest level $V^C_{TH,0}$, the select/program gate voltage $V_{PS}$, drain voltage $V_D$, source voltage $V_S$ and a substrate voltage $V_B$ of a given memory cell are determined, the two parameters of the highest level value/voltage $V_{C,0}$ and the reference voltage $V^F_{REF}$ are left from equations (7) and (8). Since the select/program gate voltage $V_{pr}$, drain voltage $V_D$ and source voltage $V_S$ are fixed, the reference voltage $V^F_{REF}$ has a one to one correspondence to the reference current $I_{REF}$. When the desired voltages $V^C_{TH,0}$, $V_{C,0}$, $V_{PS}$, $V_D$, $V_S$ and $V_B$ are applied to the memory cell, an initial drain current $I_{G,0}(0)$ is measured. The current $I_{G,0}(0)$ at this time is the same as $I_{REF}$. In this case, the voltage $V_{C,0}$ is determined by taking the programming time into consideration. Once the voltage $V_{C,0}$ is determined, the reference current $I_{REF}$ can be determined by the aforementioned method. As can be appreciated by one of ordinary skill in the art, the reference current $I_{REF}$ may be measured by various methods other than the above.

In the above, the voltage V1 expressed in equation (7) is set as a fixed constant. As can be appreciated, the parameters in the equation (7) may be adjusted to vary the voltage V1 for every threshold voltage level programming. As can be seen from the equation (8), the control gate voltage $V_{C,i}$ and the corresponding threshold voltage level $V^C_{TH,i}$ will have a nonlinear relationship. Accordingly, a shift of the control gate voltage $V_{C,i}$ and a shift of the corresponding threshold voltage $V^C_{TH,i}$ have values different from each other. In such a case, by adjusting the reference current $I_{REF}$ appropriately for every level, the threshold voltages for each level can be programmed to desired values after the nonlinear relationship of the control gate voltage $V_{C,i}$ and the corresponding threshold voltage $V^C_{TH,i}$ is obtained.

As previously discussed, an erasure is an injection of charge carriers (or electrons) into the floating gate. Therefore, the erasure can be done either with hot carrier injection or with tunneling. In the present invention, the erased state results in a threshold level to be the highest, i.e., $V^C_{TH,0}$ in the volatile memory. In other words, all the nonvolatile memory cells within a given erasure block are programmed at the highest level. Accordingly, an erasure process can be done according to the following steps using, for example, an N-type transistor.

First, electrons are injected so that threshold levels of all the cells within a selected block become higher than the 0-th level, i.e., $V^C_{TH,0}$. With the 0-th level in which the voltage of control gate 33 is $V_{C,0}$, all the selected cells are programmed. Here, as has been explained, the value of the $V_{C,0}$ may be arbitrarily chosen.

In case of a programming method of the present invention is applied to a P type transistor, a similar result can be obtained by changing the polarities of applied voltages. However, the decrease of the floating gate voltage due to injection of electrons thereto causes the transistor to go from turn off to turn on. Therefore, voltages should be applied to each gate and terminal such that the channel is turned off at an initial stage and electrons are injected into the floating gate over a period of time.

As the novel feature of the present invention explained up to now are explained irrespective of the programming mechanism, it can be appreciated that the novel feature of the present invention may be applicable to other types of programming mechanism.

Figure 8A:
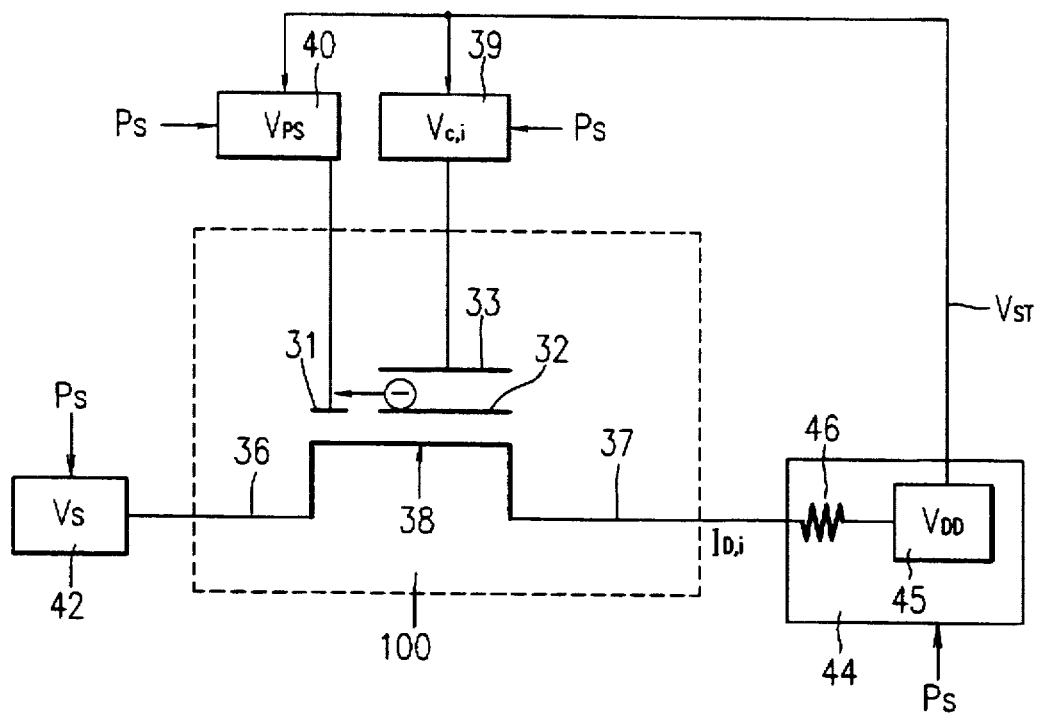
FIG. 8A is a diagram for explaining a process for programming a nonvolatile memory cell using the voltage detection method in accordance with the present invention.
Figure 8B:
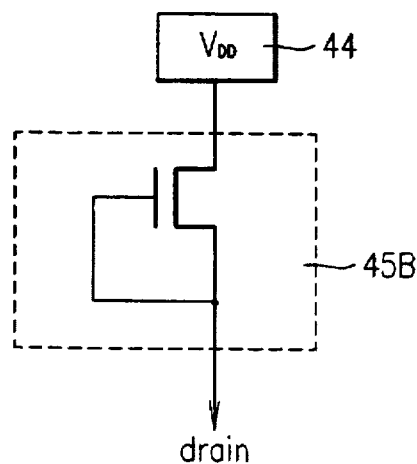
FIG. 8B illustrates a circuit showing another embodiment of the voltage detector shown in FIG. 8A.

FIGS. 8A and 8B illustrate the programming and/or verification method using voltage detection rather than current detection. The programming and/or verification method according to the voltage detection method is similar to the programming and/or verification method using current detection. For example, rather than using a current detector of FIG. 4, a voltage detector 44 is employed, as shown in FIG. 8A. In this embodiment, the voltage detector 44 includes a reference voltage source 45 and a resistor 46 connected between the reference voltage source 45 and the drain 37. Alternatively, the voltage detector 44 may include the reference voltage source and a transistor diode 45B connected between the reference voltage source and the drain, as shown in FIG. 8B.

The voltage detector 44 monitors a voltage of the drain 37 during programming and/or verification. Upon detection of the drain voltage $V_{D,TH}$ when a voltage $V_{F,i}$ at the floating gate 32, which is monitored, reaches a given threshold voltage $V^F_{TH}$, the voltage detector 44 generates a programming stop signal $V_{ST}$. The drain voltage $V_{D,TH}$ is a constant throughout all levels of programming and/or verification. Similar to the current detection method, if the first voltage source 39 and/or the second voltage source 40 stop supplying the control gate voltage $V_{C,i}$ and the program gate voltage $V_{P,i}$, respectively, in response to this programming stop signal $V_{ST}$, the programming and/or verification is ended. Since other features of the voltage detection method is similar to the current detection method, those explanations will be omitted.

Figure 9A:
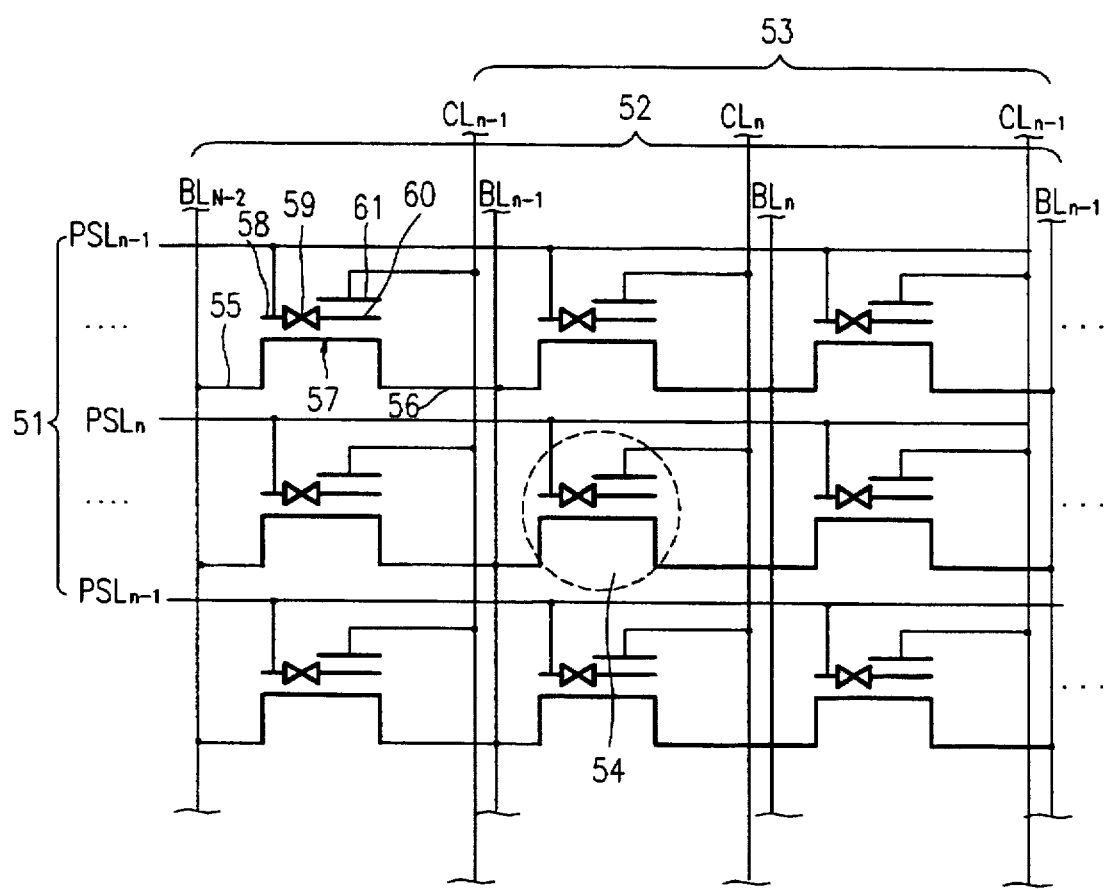
FIG. 9A illustrates a circuit of a nonvolatile memory device in accordance with one preferred embodiment of the present invention; and, FIG. 9B is a table illustrating voltages applied to each line of the nonvolatile memory device in FIG. 9A.

FIG. 9A illustrates a circuit of a nonvolatile memory device using improved nonvolatile memory cells in accordance with the present invention, and FIG. 9B illustrates a table showing the voltages applied to each line of the nonvolatile memory device in FIG. 9A. The table illustrates the voltage conditions when the nonvolatile memory device is operated in a program mode, an erasure mode and a read mode.

The nonvolatile memory device of the present invention includes a plurality of program/select lines 51 arranged in a row direction spaced apart from each other in first prescribed intervals, a plurality of bit lines 52 arranged in a column direction spaced apart from each other in second prescribed intervals at a substantially right angle to the plurality of the program/select lines 51 to form a matrix defining of a plurality of square areas, a plurality of control lines 53 disposed in the column direction adjacent to the bit lines 52, preferably in a one-to-one correspondence, and a plurality of cells 54 each disposed in one of the square areas. However, as can be appreciated, the reference to rows and columns are intended to be exemplary. As can be appreciated, the program/select lines and bit lines can be placed in columns and rows. Further, the control lines can be placed adjacent to the program/select lines.

Each of the cells has a source 56, a drain 55, a channel region 57, a select/program gate 58 for selecting a cell for programming and conducting the programming by means of received charge carriers, a floating gate 60 for storing the charge carriers by means of tunneling through the channel region in erasure of a tunneling diode 59 and providing the stored charge carriers to the program/select gate 58 through the tunneling diode 59 in programming, and a control gate 61 for controlling an amount of the charge carriers provided from the floating gate 60 to the program/select gate. The program/select gates 58 in the cells disposed on the same row are connected to one of the program/select lines 51 in common, the control gates 61 in the cells disposed on the same column are connected to one of the control lines 53 in common, and the sources (or drains) in the cells disposed on the same row are connected to one of the bit lines 52 in common, together with the drains (or sources) in the cells to disposed on an adjacent row.

For operating the nonvolatile memory device shown in FIG. 9A in a program mode, a first voltage of 10V is applied to selected program/select lines, and a second voltage of 0V is applied to unselected program/select lines. A third voltage of −6V—−3V is applied to selected control gate lines, and a fourth voltage of 5V is applied to unselected control gate lines. A fifth voltage of 1V is applied to a selected nth bit line BLn, a sixth voltage of 0V is applied to a selected (n−1)th bit line BLn−1, a seventh voltage of 1V is applied to unselected bit lines (one of BLm, for m≥n+1), and an eighth voltage of 0V is applied to other unselected bit lines (others of BLm, for ≥n+1).

The nonvolatile memory device of the present invention can be erased by two kinds of mechanism, e.g., a tunneling mechanism or a hot carrier injection mechanism. There are also two kinds of erasure mode for the tunneling mechanism, which are 1) erasure using the program/select lines and 2) erasure using the bit lines. Further, the erasure mode by hot carrier injection mechanism can be achieved through the drains or the sources. The voltages shown in FIG. 9B are exemplary, but may vary depending on the structural characteristics of the nonvolatile memory cell and electrical parameters (for example, coupling ratios, a thickness of the tunneling insulating film).

For operating the nonvolatile memory device in a tunneling erasure mode using the program/select lines, a first voltage of −8V is applied to selected program/select lines, and a second voltage of 0V is applied to unselected program/ select lines. A third voltage of 8V is applied to selected control lines, and a fourth voltage of 0V is applied to unselected control lines. Further, a fifth voltage of 0V is applied to the substrate, and all the bit lines are floating.

For operating the nonvolatile memory device in a carrier injection erasure mode using the bit lines, a first voltage of 0V is applied to selected program/select lines, and a second voltage of 0V is applied to unselected program/select lines. A third voltage of 10V is applied to selected control lines, and a fourth voltage of 0V is applied to unselected control lines. A fifth voltage of 5V is applied to selected bit lines. A sixth voltage of 0V is applied to the substrate, and the unselected bit lines are left floating.

For conducting the carrier injection erasure mode through the drains 55, a first voltage of 5V is applied to selected program/select lines, and a second voltage of 0V is applied to unselected program/select lines. A third voltage of 12V is applied to selected control lines, and a fifth voltage of 0V is applied to unselected control lines. A sixth voltage of 7V is applied to selected bit lines, and a seventh voltage of 0V is applied to the substrate. The unselected bit lines are left floating.

For conducting the carrier injection erasure mode of the nonvolatile memory device through the sources, a first voltage of 2V is applied to selected program/select lines, and a second voltage of 0V is applied to unselected program/select lines. A third voltage of 10V is applied to selected control lines, and a fourth voltage of 0V is applied to unselected control lines. A fifth voltage of 5V is applied to selected bit lines, and a sixth voltage of 0V is applied to the substrate. The unselected bit lines are left floating.

For operating the nonvolatile memory device shown in FIG. 9 in the read mode, a direct first voltage Vcc (DC) is applied to selected program/select lines, and a second voltage of 0V is applied to unselected program/select lines. The first voltage Vcc is also applied to selected control lines, and a third voltage of 0V is applied to unselected control lines. A fourth voltage of 1V is applied to selected bit lines, and a fifth voltage of 1V is applied to unselected bit lines (one of BLm, for m≧n+1), and a sixth voltage of 0V is applied to unselected other bit lines (other of BLm, for m≧n+1).

The present invention has various advantages over the related art. For example, only a variation of the control gate voltage is required for programming and/or verifying each threshold level voltage, which facilitates single or multi-level programming and/or verification. Further, since the relationship between each of the threshold voltage levels and each of the corresponding control gate voltages is linear, and the shift of the threshold voltage is identical to the shift of the control gate voltage, an accurate adjustment of the shift of each level threshold voltage is available. The method for programming a nonvolatile memory using voltage detection also allows much easier and more accurate multi-level programming compared to the current detection.

The facilitation of simultaneous programming and/or verifying within the nonvolatile memory cell eliminates a separate circuit for verifying programming of the threshold voltages, which decreases the time for programming and reduces the overall device area. The time period is further reduced since no pre-programming prior to erasure is required. Since the source and drain can be operated to be charged with a low voltage (e.g., ~1V) for reading, which is very favorable for cell size shrinkage. Since the programming stops when the cell goes from turn-off to turn-on, power consumption is very small.

The accuracy of multi-level programming, i.e., the error distribution of programmed threshold voltages, can be precisely controlled by (1) parameters fixed at the time of fabrication of the nonvolatile memory and (2) bias voltages to be applied. The error distribution of the respective levels of the nonvolatile memory of the present invention is not dependent on numerous program/erase cycles. Even during programming, the memory is not dependent on traps of charges in an oxide layer, channel mobility, bit line resistance, and unstable or unpredictable electric parameters.

The foregoing description of preferred embodiment(s) of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A nonvolatile memory device comprising:

a plurality of program/select lines arranged in a row direction spaced apart from each other at first prescribed intervals;

a plurality of bit lines arranged in a column direction spaced apart from each other in second prescribed intervals to form a matrix of a plurality of square areas; and a plurality of control lines disposed in the column direction and adjacent to the bit lines in a one-to-one correspondence;

a plurality of cells, each disposed in one of the square areas and including a source, a drain, a channel region, a select/program gate for selecting a cell for programming and conducting the programming by means of charge carriers, a floating gate for storing the charge carriers by means of tunneling through the channel region in erasure of a tunneling diode and providing the stored charge carriers to the program/select gate through the tunneling diode in programming, and a control gate for controlling an amount of the charge carriers provided from the floating gate to the program/select gate, wherein the program/select gates in the cells disposed on the same row are connected to one of the program/select lines in common, the control gates in the cells disposed on the same column are connected to one of the control lines in common, and the sources(or drains) in the cells disposed on the same row are connected to one of the bit lines in common, together with one of the drains and sources of the cells disposed on an adjacent row.

2. A nonvolatile device of claim 1, wherein a first voltage of 10V is applied to selected program/select lines, a second voltage of 0V is applied to unselected program/select lines, a third voltage of −6V—−3V is applied to selected control gate lines, a fourth voltage of 5V is applied to unselected control gate lines, a fifth voltage of 1V is applied to a selected nth bit line BLn, a sixth voltage of 0V is applied to a selected (n−1)th bit line BLn−1, a seventh voltage of 1V is applied to one of unselected bit lines BLm (m≧n+1), and an eighth voltage of 0V is applied to remaining unselected bit lines to operate the nonvolatile memory device in a program mode.

3. A nonvolatile memory device of claim 1, wherein a first voltage of −8V is applied to selected program/select lines, a second voltage of 0V is applied to unselected program/select lines, a third voltage of 8V is applied to selected control lines, a fourth voltage of 0V is applied to unselected control lines, and a fifth voltage of 0V is applied to the substrate and all the bit lines are floating to operate the nonvolatile memory device in a tunneling erasure mode using the program/select lines.

4. A nonvolatile memory device of claim 1, wherein a first voltage of 0V is applied to selected program/select lines, a second voltage of 0V is applied to unselected program/select lines, a third voltage of 10V is applied to selected control lines, a fourth voltage of 0V is applied to unselected control lines, a fifth voltage of −5V is applied to selected bit lines, and a sixth voltage of 0V is applied to the substrate, and unselected bit lines are floating such that the nonvolatile memory device operates in a tunneling erasure mode using the bit lines.

5. A nonvolatile Memory device of claim 1, wherein a first voltage of 5V is applied to selected program/select lines, a second voltage of 0V is applied to unselected program/select lines, a third voltage of 12V is applied to selected control lines, a fourth voltage of 0V is applied to unselected control lines, a fifth voltage of 7V is applied to selected bit lines, and a sixth voltage of 0V is applied to the substrate, and unselected bit lines are left floating such that the nonvolatile memory device operate in an erasure mode by hot carrier injection mechanism through the drains of selected memory cells.

6. A nonvolatile memory device of claim 1, wherein a first voltage of 2V is applied to selected program/select lines, a second voltage of 0V is applied to unselected program/select lines, a third voltage of 10V is applied to selected control lines, a fourth voltage of 0V is applied to unselected control lines, a fifth voltage of 5V is applied to selected bit lines, and a sixth voltage of 0V is applied to the substrate, and unselected bit lines are floating such that the nonvolatile memory device operates in an erasure mode by hot carrier injection mechanism through the sources of selected memory cells.

7. A nonvolatile memory device of claim 1, wherein a direct first voltage is applied to selected program/select lines, a second voltage of 0V is applied to unselected program/select lines, the first voltage is applied to selected control lines, a third voltage of 0V is applied to unselected control lines, a fourth voltage of 1V is applied to selected bit lines, a fifth voltage of 1V is applied to one of unselected bit lines BLm (m≥n+1), and a sixth voltage of 0V is applied to remaining unselected bit lines BLm (m≥n+1) to operate the nonvolatile memory device in a read mode.

8. A memory device comprising:
a) a plurality of bit lines arrange in a first direction;
b) a plurality of select lines in a second direction to form a matrix of predetermined areas;
c) a plurality of control lines in a third direction which is substantially parallel with one of said plurality of bit lines and said plurality of select lines;
d) a plurality of memory cells, each memory cell being disposed in each predetermined area defined by corresponding bit line and select line and including:
  i) first and second electrodes and a channel region therebetween, said first electrode being coupled to a corresponding bit line and said second electrode coupled to one of said plurality of bit lines adjacent to the corresponding bit line;
  ii) a first gate for storing a prescribed amount of charge carriers;
  iii) a second gate, coupled to a corresponding select line, for selecting a memory cell for a prescribed operation; and
  iv) a third gate, coupled to a corresponding control line, for inducing a transfer of charge carrier from said first gate to said second gate during programming operation, wherein
a first current path due to the transfer of charge carriers is separate from a second current path due to a current flowing between said first and second electrodes.

9. The memory device of claim 8, wherein
said first and second electrodes of each memory cell comprises first and second regions of a first conductivity type in a semiconductor substrate of a second conductivity type with channel region, corresponding to the channel being formed between the first and second regions;
said first gate being insulated and formed across a first portion of said channel region;
said second gate being insulated and formed across a second portion of said channel region, said second gate being adjacent to said first gate; and
said third gate being insulated and formed across said first gate, wherein charge carriers are transferred from said first gate to said second gate through an insulating film formed therebetween by at least one of hot carrier injection and tunneling.

10. The memory device of claim 8, wherein constant voltages are applied to said plurality of bit lines, control lines and select lines for a predetermined period of time for the prescribed operation.

11. The memory device of claim 8, wherein for programming a threshold voltage level of selected memory cell of said plurality of memory cells,
a first voltage is applied to the select line coupled to the selected memory cell;
a second voltage is applied to the control line coupled to the selected memory cell; and
a third voltage is applied to the bit line coupled to the first electrode of the selected memory cell and an unselected bit line, adjacent to the bit line coupled to the selected memory cell.

12. The memory device of claim 11, wherein the third voltage is greater than the second voltage and less than the first voltage.

13. The memory device of claim 11, wherein fourth voltage is applied to all unselected control lines, and a fifth voltage is applied to all remaining unselected select lines, a bit line coupled to the second electrode of the select memory cell and all remaining unselected bit lines.

14. The memory device of claim 13, wherein said first, second, third, fourth and fifth voltages are about 10V, −6—3V, 1V, 5V and 0V, respectively.

15. The memory device of claim 8, wherein for operating selected memory cells of said plurality of memory cells in an erasure mode of the prescribed operation, a first voltage is applied to select lines coupled to said selected memory cells and a second voltage is applied to control lines coupled to said selected memory cells, all other control lines, bit lines and select lines being one of 0V and floating.

16. The memory device of claim 15, wherein the second voltage is greater than the first voltage.

17. The memory device of claim 16, wherein the first voltage is about −8V and the second voltage is about 8V.

18. The memory device of claim 8, wherein for operating selected memory cells of said plurality of memory cells in an erasure mode of the prescribed operation, a first voltage is applied to control lines coupled to said selected memory cells and a second voltage is applied to bit lines coupled to said selected memory cells, all other control lines, bit lines and select lines being one of 0V and floating.

19. The memory device of claim 18, wherein the second voltage is less than the first voltage.

20. The memory device of claim 19, wherein the first voltage is about 10V and the second voltage is about −5V.

21. The memory device of claim 8, wherein for operating selected memory cells of said plurality of memory cells in an erasure mode of the prescribed operation, first, second and third voltages are applied to select lines, control lines and bit lines, respectively, coupled to said selected memory cells and all other control lines, bit lines and select lines being one of 0V and floating.

22. The memory device of claim 21, wherein the third voltage is greater than the first voltage and less than the second voltage.

23. The memory device of claim 22, wherein the first, second and third voltages are about 5V, 12V and 7V, respectively.

24. The memory device of claim 22, wherein the first, second and third voltages are about 2V, 10V and 5V, respectively.

25. The memory device of claim 8, wherein for operating a selected memory cell of said plurality of memory cells in a read mode of the prescribed operation, a source potential is applied to the select line and the control line coupled to the selected memory cell;

a prescribed voltage is applied to the bit line coupled to the first electrode of the selected memory cell and an unselected bit line, adjacent to the bit line coupled to the selected memory cell.

* * * * *